(12) United States Patent
Itou et al.

(10) Patent No.: US 9,576,854 B2
(45) Date of Patent: Feb. 21, 2017

(54) PEELING APPARATUS, PEELING SYSTEM, AND PEELING METHOD

(71) Applicant: Tokyo Electron Limited, Tokyo (JP)

(72) Inventors: Masanori Itou, Kumamoto (JP); Ryoichi Sakamoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/007,403

(22) Filed: Jan. 27, 2016

(65) Prior Publication Data
US 2016/0225670 A1  Aug. 4, 2016

(30) Foreign Application Priority Data

Feb. 4, 2015 (JP) .................................. 2015-019876

(51) Int. Cl.
| | |
|---|---|
| *B32B 38/10* | (2006.01) |
| *H01L 21/78* | (2006.01) |
| *H01L 21/67* | (2006.01) |
| *H01L 21/66* | (2006.01) |
| *B32B 43/00* | (2006.01) |

(52) U.S. Cl.
CPC ......... *H01L 21/78* (2013.01); *H01L 21/67092* (2013.01); *H01L 21/67253* (2013.01); *H01L 22/12* (2013.01); *B32B 38/10* (2013.01); *B32B 43/006* (2013.01); *Y10T 156/1179* (2015.01); *Y10T 156/1184* (2015.01); *Y10T 156/1961* (2015.01); *Y10T 156/1967* (2015.01)

(58) Field of Classification Search
CPC .. B32B 38/10; B32B 43/006; Y10T 156/1179; Y10T 156/1184; Y10T 156/1961; Y10T 156/1967

USPC ........ 156/716, 717, 761, 762, 930, 941, 943
See application file for complete search history.

(56) References Cited

U.S. PATENT DOCUMENTS

| 6,227,276 | B1* | 5/2001 | Kim ..................... | B29C 63/0013 156/247 |
|---|---|---|---|---|
| 6,263,941 | B1* | 7/2001 | Bryan .................. | B28D 5/0011 156/239 |
| 8,302,278 | B2* | 11/2012 | Zussy .................. | B28D 5/0017 29/239 |
| 2004/0144487 | A1* | 7/2004 | Martinez .............. | B28D 5/0011 156/765 |
| 2005/0000649 | A1* | 1/2005 | Rayssac ............... | B28D 5/0011 156/717 |

(Continued)

FOREIGN PATENT DOCUMENTS

JP      2014-165281 A      9/2014

*Primary Examiner* — Mark A Osele
*Assistant Examiner* — Nickolas Harm
(74) *Attorney, Agent, or Firm* — Abelman, Frayne & Schwab

(57) ABSTRACT

Provided is a peeling apparatus configured to suppress damage to a substrate, by forming a peeling start point. The peeling apparatus separates a superimposed substrate made by joining first and second substrates into the first and second substrates, and includes a blade configured to form a notch as a peeling start point between the first and second substrates, and an inspection unit configured to inspect a state of a cutting edge of the blade. The inspection unit includes an imaging unit configured to image the cutting edge of the blade, and an image processing unit configured to process an image of the imaging unit.

14 Claims, 10 Drawing Sheets

(56) References Cited

U.S. PATENT DOCUMENTS

| | | | | |
|---|---|---|---|---|
| 2013/0248119 A1* | 9/2013 | Hwang | ............ | H01L 21/67092 156/711 |
| 2014/0332166 A1* | 11/2014 | Honda | ............. | H01L 21/67092 156/708 |
| 2015/0239227 A1* | 8/2015 | Itou | .................. | H01L 21/67092 156/716 |

* cited by examiner

PEELING APPARATUS, PEELING SYSTEM, AND PEELING METHOD

CROSS-REFERENCE TO RELATED APPLICATIONS

This application is based on and claims priority from Japanese Patent Application No. 2015-019876, filed on Feb. 4, 2015, with the Japan Patent Office, the disclosure of which is incorporated herein in its entirety by reference.

TECHNICAL FIELD

The present disclosure relates to a peeling apparatus, a peeling system, and a peeling method.

BACKGROUND

Recently, in a process of manufacturing a semiconductor device, for example, the diameter increase and thickness reduction of a substrate such as, for example, a silicon wafer or a compound semiconductor wafer, is progressing. A large and thin substrate may be warped or cracked during conveyance or polishing. Therefore, the conveyance or polishing is performed after gluing a separate substrate to the substrate to reinforce the substrate, and then a peeling process is performed so as to separate the substrates from each other. Further, in order to form a peeling start point when peeling the substrates from each other, a blade is inserted between the substrates to form a notch (see, e.g., Japanese Patent Laid-Open Publication No. 2014-165281).

SUMMARY

According to an aspect of the present disclosure, there is provided a peeling apparatus that separates a superimposed substrate, in which first and second substrates are glued to each other, into the first substrate and the second substrate. The peeling apparatus includes: a blade configured to form a notch as a peeling start point between the first and second substrates; and an inspection unit configured to inspect a state of a cutting edge of the blade. The inspection unit includes: an imaging unit configured to image the cutting edge; and an image processing unit configured to process the image of the imaging unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
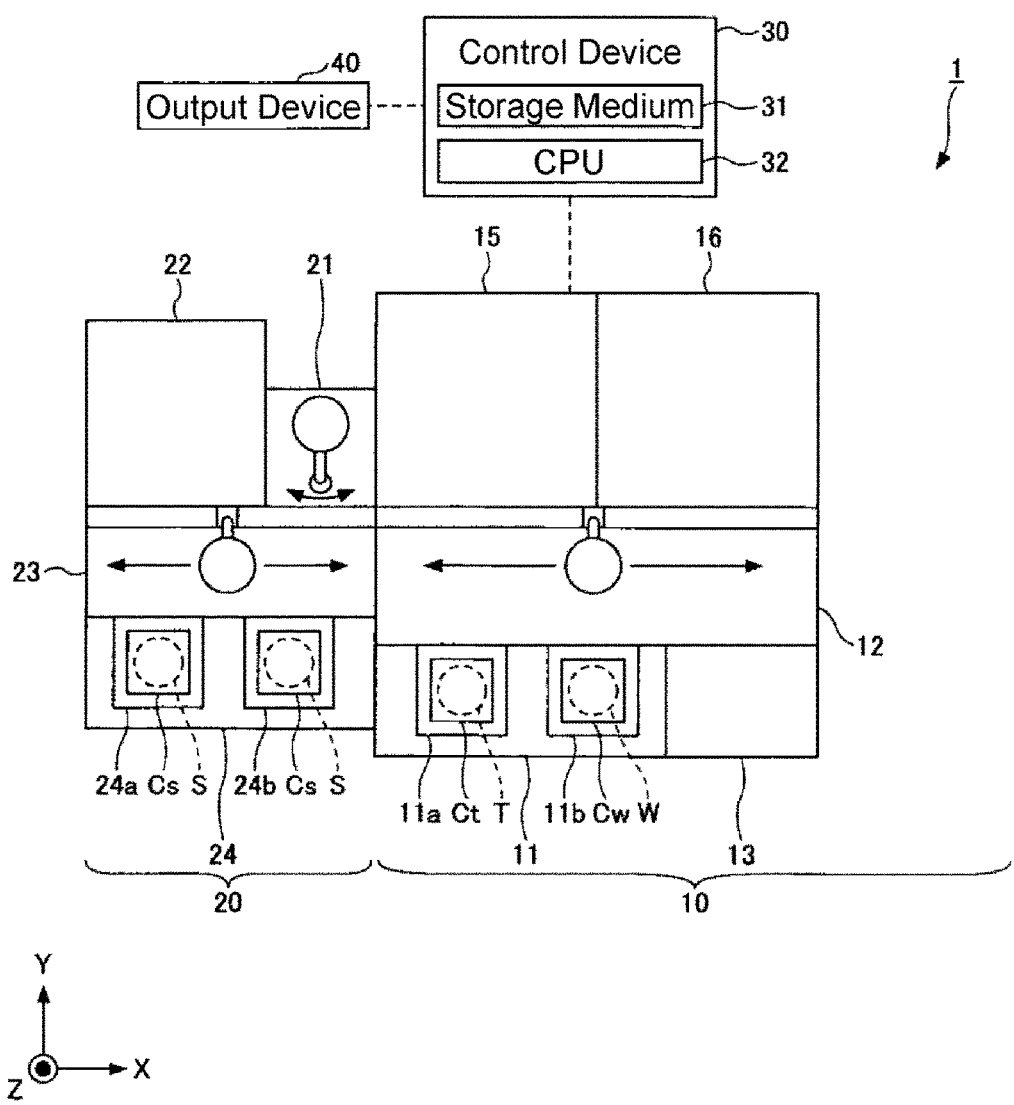
FIG. 1 is a plan view schematically illustrating a peeling system according to an exemplary embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

When a peeling start point is formed on a substrate using a blade having a damaged cutting edge, the substrate may be damaged.

Accordingly, the present disclosure has been made in consideration of the above-mentioned problems occurring in the related art, and is mainly intended to provide a peeling apparatus which suppresses a substrate from being damaged by the formation of a peeling start point.

In order to solve the above-mentioned problem, according to an aspect of the present disclosure, there is provided a peeling apparatus that separates a superimposed substrate, in which first and second substrates are glued to each other, into the first substrate and the second substrate. The peeling apparatus includes: a blade configured to form a notch as a peeling start point between the first and second substrates; and an inspection unit configured to inspect a state of a cutting edge of the blade. The inspection unit includes: an imaging unit configured to image the cutting edge; and an image processing unit configured to process an image of the imaging unit.

The above-described peeling apparatus further includes a position change unit configured to change a notching start position of the cutting edge, based on an inspected result of the inspection unit.

The imaging unit partially images the cutting edge, and the inspection unit includes an imaging region change unit configured to change an imaging region of the cutting edge.

The image processing unit prepares a map indicating the state of the cutting edge, by processing a plurality of images of different imaging regions.

The inspection unit includes a light source unit to irradiate light to the cutting edge, the image includes a dark portion formed when the light is screened by the blade, and a bright portion formed when the light pass outside the blade, and the image processing unit detects a border line between the dark portion and the bright portion.

According to another aspect of the present disclosure, there is provided a peeling apparatus that separates a superimposed substrate, in which a first substrate and a second substrate are glued to each other, into the first substrate and the second substrate. The peeling apparatus includes: a blade configured to form a notch as a peeling start point between the first substrate and the second substrate; an inspection unit configured to inspect a state of a cutting edge of the blade; and a position change unit configured to change a notching start position of the cutting edge, based on an inspected result of the inspection unit.

The above peeling apparatus further includes: an output unit configured to output an alarm based on the inspected result of the inspection unit.

According to yet another aspect of the present disclosure, there is provided a peeling system including a peeling apparatus configured to separate a superimposed substrate, in which a first substrate and a second substrate are glued to each other, into the first substrate and the second substrate; and a cleaning unit configured to clean the first substrate that has been subjected to stripping. The above-described peeling apparatus is provided as the peeling apparatus.

According to still another aspect of the present disclosure, there is provided a peeling method of separating a superimposed substrate, in which a first substrate and a second substrate are glued to each other, into the first substrate and the second substrate. The peeling method includes: a processing step of forming a notch as a peeling start point by inserting a blade between the first substrate and the second substrate, and separating the first substrate and the second substrate from each other from the peeling start point; and an inspection step of inspecting a state of a cutting edge by imaging the cutting edge of the blade using an imaging unit and processing the image obtained by the imaging unit.

The above-described peeling method further includes: a position change step of changing a notching start position of the cutting edge, based on an inspected result of the inspection step.

The imaging unit partially images the image of the cutting edge, and in the inspection step, imaging is repeatedly performed by the imaging unit while changing an imaging region of the cutting edge.

In the inspection step, a map indicating the state of the cutting edge is prepared by processing a plurality of images of different imaging regions.

In the inspection step, light is irradiated to the cutting edge, the image includes a dark portion formed when the light is screened by the blade, and a bright portion formed when the light pass outside the blade, and in the inspection step, a border line is detected between the dark portion and the bright portion.

According to yet another aspect of the present disclosure, there is provided peeling method of separating a superimposed substrate, in which a first substrate and a second substrate are glued to each other, into the first substrate and the second substrate. The peeling method includes: a processing step of forming a notch as a peeling start point by inserting a blade between the first substrate and the second substrate, and separating the first substrate and the second substrate from each other from the peeling start point; an inspection step of inspecting a state of a cutting edge of the blade; and a position change step of changing a notching start position of the cutting edge, based on an inspected result of the inspection step.

The above-described peeling method further includes: an output step of outputting an alarm based on the inspected result of the inspection step.

According to an aspect of the present disclosure, there is provided a peeling apparatus that suppresses a substrate from being damaged by forming a peeling start point.

Hereinafter, exemplary embodiments of the present disclosure will be described with reference to the accompanying drawings. The same or similar components will be denoted by the same or similar reference numeral throughout different drawings, and a duplicate description thereof will be omitted herein. In the following description, an X direction, a Y direction, and a Z direction are directions that are perpendicular to each other. The X direction and the Y direction are horizontal directions, and the Z direction is a vertical direction.

Figure 2:
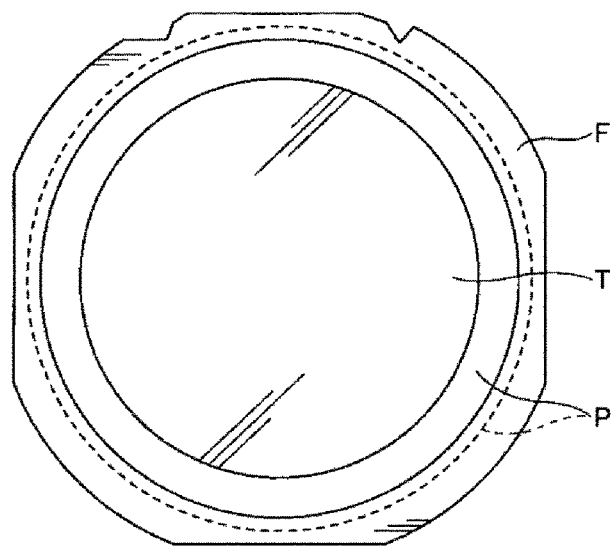
FIG. 2 is a plan view illustrating a superimposed substrate according to an exemplary embodiment.
Figure 3:
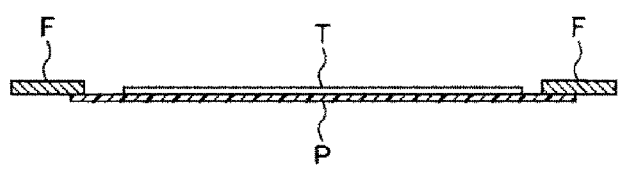
FIG. 3 is a sectional view illustrating the superimposed substrate according to the exemplary embodiment.
Figure 4:
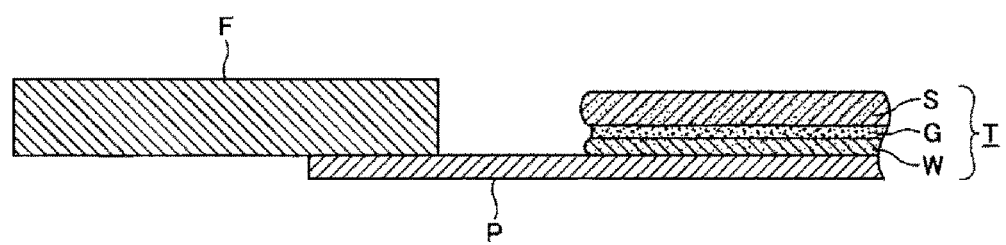
FIG. 4 is a view illustrating a portion of FIG. 3 in an enlarged scale.

FIG. 1 is a plan view schematically illustrating a peeling system according to an exemplary embodiment. FIG. 2 is a plan view illustrating a superimposed substrate according to an exemplary embodiment. FIG. 3 is a sectional view illustrating the superimposed substrate according to the exemplary embodiment. FIG. 4 is a view illustrating a portion of FIG. 3 in an enlarged scale.

A peeling system 1 separates a superimposed substrate T, in which a processing target substrate W and a support substrate S are glued to each other via a glue layer G, into a processing target substrate W and a support substrate S. Further, the peeling system 1 cleans the gluing surface of the processing target substrate W after the separation, and removes residual debris from the glue layer G attached to the gluing surface.

The processing target substrate W corresponds to a first substrate described in claims, while the support substrate S corresponds to a second substrate described in claims. Further, the processing target substrate W may correspond to the second substrate, while the support substrate S may correspond to the first substrate.

The processing target substrate W refers to a substrate, on which an element, a circuit, a terminal or the like are is formed on. The surface of the processing target substrate, on which the element, the circuit, the terminal, or the like is formed, becomes the gluing surface. A surface opposite to the gluing surface of the processing target substrate W is polished after gluing, so that the processing target substrate W is thinned. Hereinafter, the surface opposite to the gluing surface may also be referred to a non-gluing surface. After polishing, a surface electrode, a penetration electrode, or the like may be formed on the non-gluing surface of the processing target substrate W. Further, the processing target substrate W may be formed by stacking a plurality of substrates.

The support substrate S is glued to the processing target substrate W to temporarily reinforce the processing target substrate W. The support substrate S is separated from the processing target substrate W after the processing target substrate W has been polished. The separated support substrate S may be cleaned and then glued to another processing target substrate W.

The glue layer G glues the processing target substrate W and the support substrate S to each other. The glue layer G may include any one of a thermoplastic resin and a thermosetting resin. Further, the glue layer G may be any of a single-layer structure or a multilayer structure.

As illustrated in FIGS. 2 to 4, the superimposed substrate T is adhered to a tape P that is secured to an inner circumference of a frame F, and thereby is held on the frame F. The tape P covers the opening of the frame F. As the frame F, for example, a dicing frame is used, and as the tape P, for example, a dicing tape is used.

The superimposed substrate T is separated into the processing target substrate W and the support substrate S in the state of being held on the frame F. After having been separated, the processing target substrate W is fed to a cleaning process while being held on the frame F. In the cleaning process, the residual debris of the glue layer G is removed from the gluing surface of the processing target substrate W.

As shown in FIG. 1, the peeling system 1 includes a first processing block 10, a second processing block 20, a control device 30, and an output device 40.

The first processing block 10 processes the superimposed substrate T or the separated processing target substrate W. The first processing block 10 includes a carrying-in/out station 11, a first conveyance apparatus 12, a standby apparatus 13, a peeling apparatus 15, and a first cleaning apparatus 16.

The carrying-in/out station 11 carries cassettes Ct and Cw in from/out to the outside. The carrying-in/out station 11 has a cassette mounting table, which includes a plurality of mounting sections 11a and 11b. The cassettes Ct and Cw are placed on the mounting sections 11a and 11b, respectively. The cassette Ct accommodates a plurality of superimposed substrates T, and the cassette Cw accommodates a plurality of separated processing target substrates W. The superimposed substrates T and the separated processing target substrates W are accommodated in the cassettes Ct and Cw, respectively, in the state of being held on the frame F.

The first conveyance apparatus 12 conveys the superimposed substrate T or the separated processing target substrate W. The first conveyance apparatus 12 includes a conveyance arm and a substrate holding unit. The conveyance arm is provided to be movable in a horizontal direction, movable up and down in a vertical direction, and rotatable about a vertical axis. The substrate holding unit approximately horizontally holds the superimposed substrate T or the separated processing target substrate W by holding the frame F. The first conveyance apparatus 12 conveys the substrate held by the substrate holding unit to a desired place by the conveyance arm.

The standby apparatus 13 temporarily keeps thereon a superimposed substrate T to be processed. The standby apparatus 13 includes a mounting table. The superimposed substrate T is placed on the mounting table. An ID reading device is provided on the mounting table. The ID reading device reads the ID (Identification) of the frame F so as to identify the superimposed substrate T.

The peeling apparatus 15 separates the superimposed substrate T into the processing target substrate W and the support substrate S. The superimposed substrate T is separated into the processing target substrate W and the support substrate S in the state of being held on the frame F. The separated processing target substrate W remains on the frame F. The peeling apparatus 15 will be described below in detail.

The first cleaning apparatus 16 cleans the separated processing target substrate W. The separated processing target substrate W is cleaned in the state where the non-gluing surface is attached to the tape P. The cleaning removes the residual debris of the glue layer G from the gluing surface of the processing target substrate W.

Meanwhile, the second processing block 20 processes the separated support substrate S. The second processing block 20 includes a transfer apparatus 21, a second cleaning apparatus 22, a second conveyance apparatus 23, and a carrying-out station 24.

The transfer apparatus 21 receives the separated support substrate S from the peeling apparatus 15, and then transfers the support substrate to the second cleaning apparatus 22.

The second cleaning apparatus 22 cleans the separated support substrate S. As the second cleaning apparatus 22, for example, the cleaning apparatus described in Japanese Patent Laid-Open Publication No. 2013-033925 is used.

The second conveyance apparatus 23 conveys the separated support substrate S to the carrying-out station 24. The second conveyance apparatus 23 includes a conveyance arm and a substrate holding unit, similarly to the first conveyance apparatus 12. The substrate holding unit provided in the second conveyance apparatus 23 approximately horizontally holds the support substrate S, for example, by supporting the support substrate S from the lower side.

The carrying-out station 24 carries a cassette Cs in from/out to the outside. The carrying-out station 24 has a cassette mounting table, which has a plurality of mounting sections 24a and 24b. The cassette Cs is placed on each of the mounting sections 24a and 24b. The cassette Cs accommodates a plurality of separated support substrates S.

The control device 30 is configured by a computer including, for example, a storage medium 31 such as, for example, a memory, and a CPU (Central Processing Unit) 32, and implements various processes by executing a program (also referred to as a "recipe") stored in the storage medium 31 in the CPU 32. Further, the control device 30 is provided separately from the peeling apparatus 15 in FIG. 1, but may be a part of the peeling apparatus 15.

A program of the control device 30 is stored in a data storage medium, and is installed from the data storage medium. As the data storage medium, for example, a hard disc (HD), a flexible disc (FD), a compact disc (CD), a magnet optical disc (MO), or a memory card may be used. Furthermore, the program may be installed by being downloaded from a server through the internet.

As the output device 40, for example, a display configured to display an image, or a speaker configured to output sound may be used. In addition, the output device 40 is provided separately from the peeling apparatus 15 in FIG. 1, but may be a part of the peeling apparatus 15. The output device 40 corresponds to an output unit described in claims.

Figure 5:
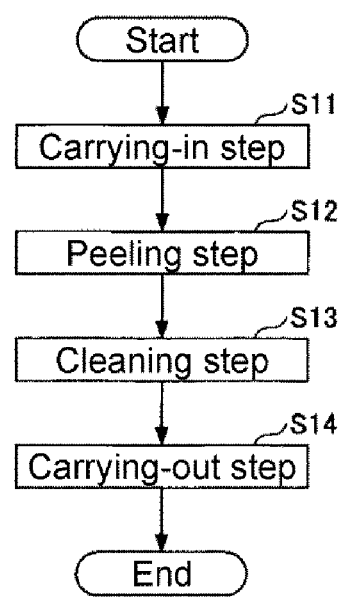
FIG. 5 is a flowchart illustrating a peeling method according to an exemplary embodiment.

Next, a peeling method using the peeling system 1 will be described with reference to FIG. 5. FIG. 5 is a flowchart illustrating a peeling method according to an exemplary embodiment. Here, the peeling method will be described mainly focusing on the processing target substrate W.

The peeling method includes a carrying-in step S11, a peeling step S12, a cleaning step S13, and a carrying-out step S14. These steps are performed under the control of the control device 30.

In the carrying-in step S11, the first conveyance apparatus 12 conveys a superimposed substrate T from a cassette Ct on a mounting section 11a to the standby apparatus 13, and subsequently, conveys the superimposed substrate from the standby apparatus 13 to the peeling apparatus 15.

In the peeling step S12, the peeling apparatus 15 separates the superimposed substrate T into a processing target substrate W and a support substrate S. The superimposed substrate T is separated into the processing target substrate W and the support substrate S in the state of being held on the frame F. The separated processing target substrate W remains on the frame F. The separated processing target substrate W is conveyed by the first conveyance apparatus 12 from the peeling apparatus 15 to the first cleaning apparatus 16.

In the cleaning step S13, the first cleaning apparatus 16 cleans the separated processing target substrate W. The separated processing target substrate W is cleaned with the non-gluing surface adhering to the tape P. The cleaning removes the residual debris of the glue layer G from the gluing surface of the processing target substrate W.

In the carrying-out step S14, the first conveyance apparatus 12 conveys the separated processing target substrate W to the cassette Cw on the mounting section 11b.

In this way, the separated processing target substrate W is cleaned by the first cleaning apparatus 16, and then is accommodated in the cassette Cw. Simultaneously, the separated support substrate S is cleaned by the second cleaning apparatus 22, and then accommodated in the cassette Cs.

Further, the peeling system 1 is not limited to the above-described configuration. For example, the peeling system 1 may have a mount apparatus. The mount apparatus attaches the superimposed substrate T to the tape P secured to the inner circumference of the frame F. The superimposed substrate T is mounted inside the peeling system 1 rather than outside the peeling system 1. In addition, the peeling system 1 may have various inspection devices. As the inspection devices, an inspection device that inspects the presence or absence of residues on the processing target substrate W after cleaning or the support substrate S after cleaning, and an inspection device that inspects electrical properties an element or the like of the processing target substrate after cleaning may be used.

Figure 6:
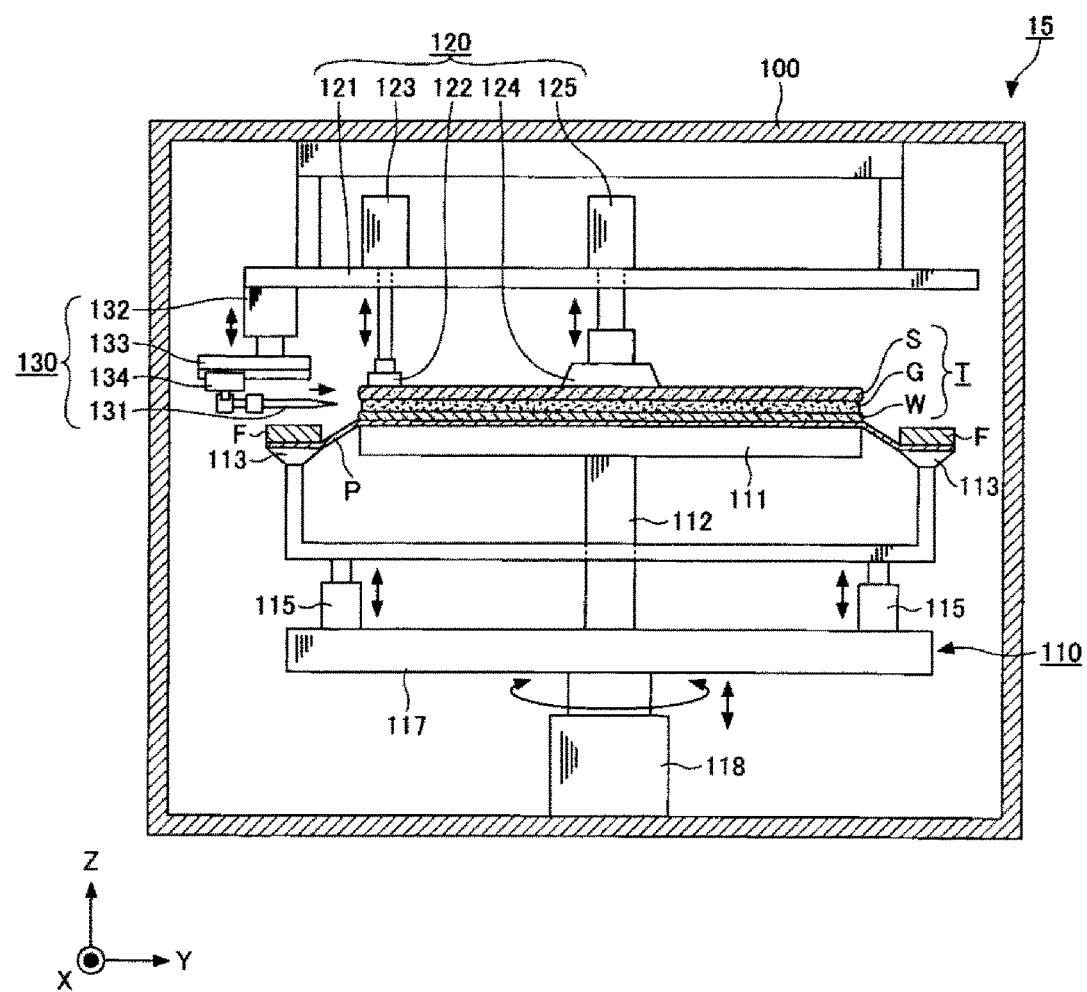
FIG. 6 is a sectional view illustrating a peeling apparatus according to an exemplary embodiment.
Figure 7:
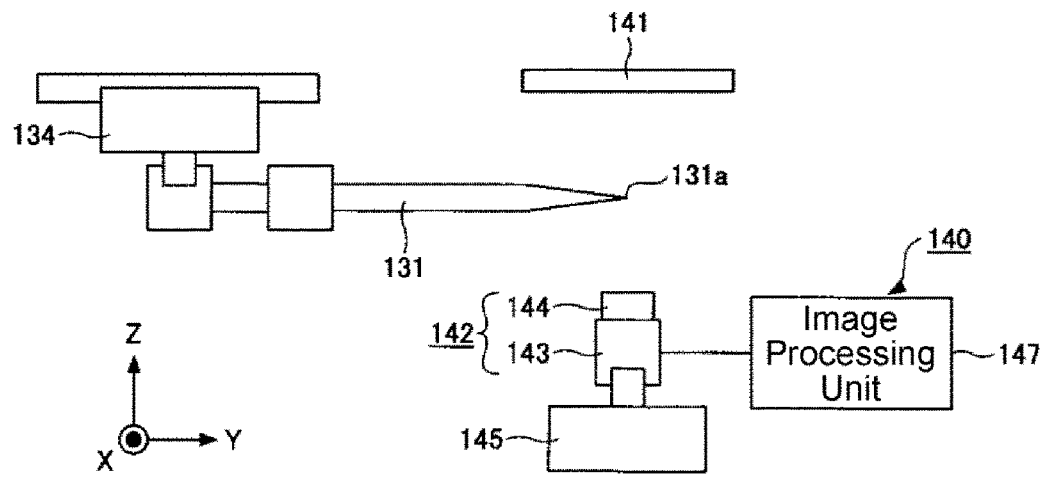
FIG. 7 is a side view illustrating an inspection unit according to an exemplary embodiment.
Figure 8:
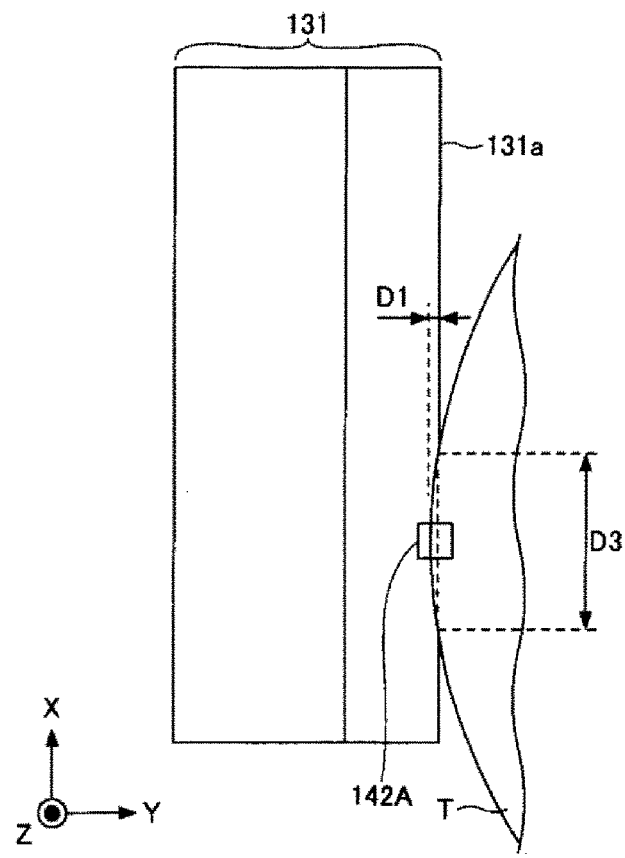
FIG. 8 is a plan view illustrating an imaging region imaged by an imaging unit according to an exemplary embodiment, in which a positional relation between a blade and the superimposed substrate is illustrated in the state illustrated FIG. 14.
Figure 9:
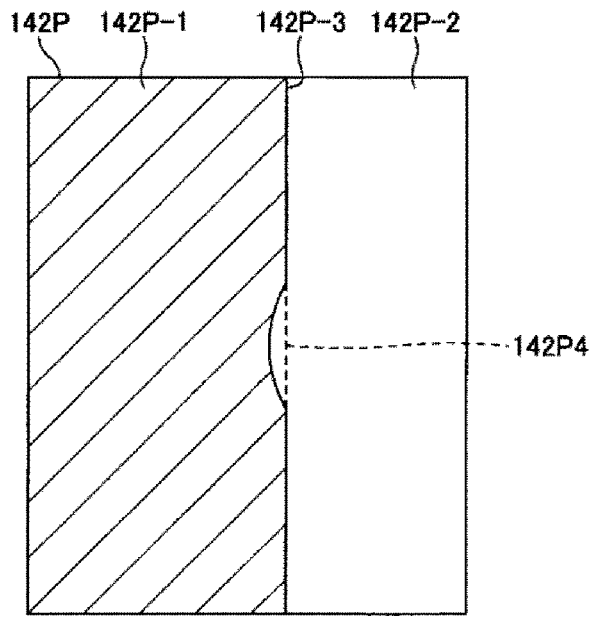
FIG. 9 is a view illustrating an image obtained by the imaging unit according to the exemplary embodiment.
Figure 14:
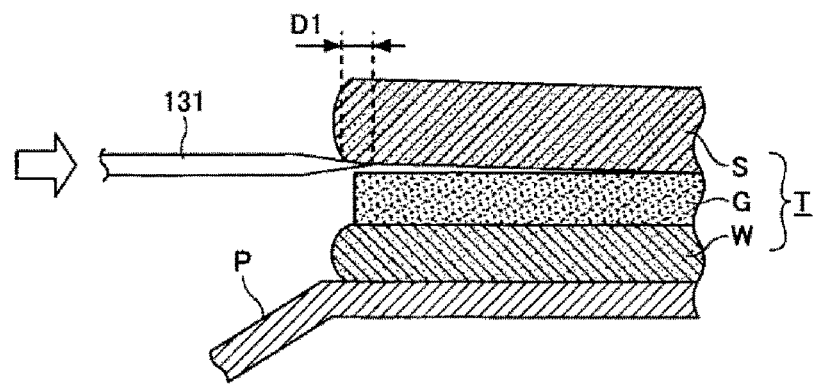
FIG. 14 is a view illustrating an exemplary state in which the blade is further moved in the inserting direction from the state of FIG. 13.

Next, the peeling apparatus 15 will be described in detail with reference to FIGS. 6 to 9. FIG. 6 is a sectional view illustrating a peeling apparatus according to an exemplary embodiment. FIG. 7 is a side view illustrating an inspection unit according to an exemplary embodiment. FIG. 8 is a plan view illustrating an imaging region imaged by an imaging unit according to an exemplary embodiment, in which a positional relation between a blade and the superimposed substrate in a state of FIG. 14 is illustrated. FIG. 9 is a view illustrating an image obtained by the imaging unit according to the exemplary embodiment. In FIG. 9, a dark portion is hatched in order to make the drawing easy to see.

The peeling apparatus 15 is provided with a processing container 100. A carrying-in/out port (not illustrated) is formed in a side surface of the processing container 100, and, for example, an opening/closing shutter is provided on the carrying-in/out port. The carrying-in/out port is provided on each of a side surface of the first conveyance apparatus 12 of the processing container 100 and a side surface of the transfer apparatus 21 of the processing container 100. A superimposed substrate T is carried into the processing container 100 through the carrying-in/out port, and is separated into a processing target substrate W and a support substrate S within the processing container 100. Thereafter, the processing target substrate W and the support substrate S are carried out of the processing container 100 through the carrying-in/out port.

The peeling apparatus 15 includes a first holding unit 110, a second holding unit 120, a peeling-starting-point forming unit 130, and a part of an inspection unit 140 (see, e.g., FIG. 7) (e.g., a light source unit 141, an imaging unit 142, or an imaging region change unit 145) within the processing container 100. Further, the peeling apparatus 15 includes the remaining part of the inspection unit 140 (e.g., an image processing unit 147), outside the processing container 100.

The first holding unit 110 holds the processing target substrate W from the lower side via the tape P, and holds the frame F from the lower side. The first holding unit 110 has a substrate holding unit 111, a column, a frame holding unit 113, a lifting driving unit 115, a rotary lifting base 117, and a rotary lifting driving unit 118.

The substrate holding unit 111 holds the processing target substrate W from the lower side via the tape P. The substrate holding unit 111 is composed of, for example, a porous chuck, and vacuum sucks the processing target substrate W via the tape P. The substrate holding unit 111 is secured to the rotary lifting base 117 via the column 112.

The frame holding unit 113 holds the frame F from the lower side. The frame holding unit 113 is composed of, for example, a vacuum suction pad, and vacuum sucks the frame F. A plurality of (e.g., four) frame holding units 113 are provided at predetermined intervals in a circumferential direction of the frame F.

The lifting driving unit 115 is attached to the rotary lifting base 117, and integrally moves up and down the plurality of frame holding units 113 relative to the substrate holding unit 111. The lifting driving unit 115 is composed of, for example, a cylinder.

The rotary lifting driving unit 118 is attached to the bottom of the processing container 100. The rotary lifting driving unit 118 rotates the rotary lifting base 117 around a vertical axis, thereby causing the substrate holding unit 111 and the frame holding unit 113 to be integrally rotated. Further, the rotary lifting driving unit 118 moves the rotary lifting base 117 up and down, thereby causing the substrate holding unit 111 and the frame holding unit 113 to be integrally rotated.

The second holding unit 120 holds the support substrate S from the upper side. The second holding unit 120 includes a fixed base 121, a substrate-periphery holding unit 122, a substrate-periphery moving unit 123, a substrate-center holding unit 124, and a substrate-center moving unit 125.

The fixed base 121 is secured to the ceiling of the processing container 100. The substrate-periphery moving unit 123 and the substrate-center moving unit 125 are attached to the fixed base 121.

The substrate-periphery holding unit 122 sucks a peripheral portion of the support substrate S (in detail, a vicinity of a peeling start point that will be described later) from the upper side. The substrate-periphery holding unit 122 is composed of, for example, a vacuum suction pad, and sucks by vacuum the peripheral portion of the support substrate S from the upper side.

The substrate-periphery moving unit 123 is attached to the fixed base 121, and moves the substrate-periphery holding unit 122 up and down relative to the fixed base 121 so as to move the peripheral portion of the support substrate S up and down. The substrate-periphery moving unit 123 is composed of, for example, a cylinder.

The substrate-center holding unit 124 sucks the central portion of the support substrate S from the upper side. The substrate-center holding unit 124 is composed of, for example, a vacuum suction pad, and sucks by vacuum the central portion of the support substrate S from the upper side.

The substrate-center moving unit 125 is attached to the fixed base 121, and moves the substrate-center holding unit 124 up and down relative to the fixed base 121 to move the central portion of the support substrate S up and down. The substrate-center moving unit 125 is composed of, for example, a cylinder.

As will be described later in detail, the peeling apparatus holds the superimposed substrate T from the upper side, the lower side, and both sides by the first and second holding units 110, and moves the substrate-periphery holding unit 122 up prior to the substrate-center holding unit 124, thereby causing the support substrate S and the processing target substrate W to be gradually peeled off from the peeling start point.

The peeling-starting-point forming unit 130 forms a notch as the peeling start point between the support substrate S and the processing target substrate W. The peeling-starting-point forming unit 130 is attached to, for example, the fixed base 121. The peeling-starting-point forming unit 130 includes a blade 131, a Z direction moving unit 132, a Y direction moving unit 133, and an X direction moving unit 134.

The blade 131 is inserted between the support substrate S and the processing target substrate W, and forms a notch therebetween as the peeling start point. The blade 131 is formed to in a rectangular plate shape, for example, as shown in FIGS. 7 and 8. The longitudinal direction of the blade 131 is the X direction, while the inserting direction of the blade 131 is the Y direction. Further, the blade 131 may have, for example, a disc shape without being limited to the rectangular plate shape.

Each of the Z direction moving unit 132, the Y direction moving unit 133, and the X direction moving unit 134 includes, for example, a motor, a ball screw that converts a rotary motion of the motor into a rectilinear motion thereof, or a cylinder.

The Z direction moving unit 132 moves the blade 131 in the Z direction relative to the first or second holding unit 110 or 120 so as to adjust the height of the blade 131.

The Y direction moving unit 133 moves the blade 131 in the Y direction relative to the first or second holding unit 110 or 120 so as to insert the blade 131 between the support and processing target substrates S and W.

The X direction moving unit 134 moves the blade 131 in the X direction relative to the first or second holding unit 110 or 120 so as to change the notching start of the cutting edge 131*a* of the blade 131 starts cutting. The notching start position of the cutting edge 131*a* refers to a position where a portion of the cutting edge 131*a* initially comes into contact with the superimposed substrate T. The X direction moving unit 134 corresponds to a position change unit described in claims.

When the blade 131 has a disc shape, the notching start position of the cutting edge 131*a* may be changed by rotating the blade 131.

The inspection unit 140 inspects the state of the cutting edge 131*a*. Inspection items may include, for example, the existence/non-existence of a defect and the position of the defect. The inspection unit 140 includes a light source unit 141, an imaging unit 142, an imaging region change unit 145, and an image processing unit 147, as illustrated in FIG. 7.

The light source unit 141 irradiates light to the cutting edge 131*a*. The light source unit 141 is a surface light source as shown in FIG. 7, but may be a point light source.

The imaging unit 142 images the cutting edge 131*a*. The imaging unit 142 includes, for example, an imaging element 143 and a prism 144. The imaging element 143 is composed of, for example, a charge coupled device (CCD) or a complementary metal oxide semiconductor (CMOS). The imaging element 143 images the cutting edge 131*a* through the prism 144 or the like. The prism 144 bends an optical path. Furthermore, the prism 144 may be omitted.

The imaging unit 142 partially images the cutting edge 131*a* so that a detailed portion of the cutting edge 131*a* can be magnified and imaged. The imaging unit 142 images a portion of the cutting edge 131*a* that initially comes into contact with the superimposed substrate T, as illustrated in FIG. 8. Since a larger load acts on the above-mentioned portion than other portions when the peeling start point is formed, the above-mentioned portion is easily damaged.

The imaging unit 142 is provided on a side opposite to the light source unit 141, with reference to the blade 131. As shown in FIG. 9, an image 142P obtained by the imaging unit 142 has a dark portion 142P-1 and a bright portion 142P-2. The dark portion 142P-1 is formed when the light from the light source unit 141 is screened by the blade 131. Meanwhile, the bright portion 142P-2 is formed when the light from the light source unit 141 pass outside the blade 131. A border line 142P-3 between the dark portion 142P-1 and the bright portion 142P-2 represents the cutting edge 131*a*.

The imaging region change unit 145 changes an imaging region of the cutting edge 131*a* imaged by the imaging unit 142. The imaging region change unit 145 includes, for example, a motor and a ball screw that converts a rotary motion of the motor into a rectilinear motion thereof. The imaging region change unit 145 changes the imaging region of the cutting edge 131*a* by moving the imaging unit 142 in a direction (X direction in FIG. 8) following the cutting edge 131*a*, for example. A plurality of images for different imaging regions are obtained.

In the case of moving the imaging unit 142, the imaging region change unit 145 may move the light source unit 141 integrally with the imaging unit 142. An exemplary case in which the light source unit 141 is moved may be a case where the light source unit 141 is the point light source. When the light source unit 141 is the surface light source and is long in the X direction, the movement of the light source unit 141 is unnecessary.

The imaging region change unit 145 according to this exemplary embodiment moves the imaging unit 142. However, the imaging region change unit 145 may move either or both of the imaging unit 142 and the blade 131 may be moved. When the blade 131 is moved in the X direction, the X direction moving unit 134 may also serve as the imaging region change unit 145. Further, when the blade 131 has the disc shape, the imaging region of the blade 131 may be changed by rotating the blade 131.

The imaging region change unit 145 may include a position sensor to detect a relative position between the imaging unit 142 and the blade 131. The position sensor outputs a detected result to the image processing unit 147 and the control device 30. The control device 30 controls the imaging region of the cutting edge 131*a* imaged by the imaging unit 142, based on the detected result of the position sensor.

In this exemplary embodiment, the image processing unit 147 and the control device 30 are separately provided. However, the control device 30 may also serve as the image processing unit 147.

The image processing unit 147 inspects the state of the cutting edge 131a by processing the image 142P of the imaging unit 142. The inspection items may include the existence/non-existence of a defect and a position of the defect. The existence/non-existence of a defect is determined depending on, for example, whether a characteristic amount of the shape of the cutting edge 131a is not less than a predetermined value. The characteristic amount may include, for example, a width, a depth or an area of a recess formed in the cutting edge 131a. The position of the defect may be calculated based on, for example, a position of a recess in the image 142P or a relative position between the imaging unit 142 and the blade 131.

The image processing unit 147 detects, for example, the border line 142P-3 between the dark portion 142P-1 and the bright portion 142P-2. Since an abrupt change in luminance occurs in the border line 142P-3, the border line 142P-3 is clear. The border line 142P-3 represents the cutting edge 131a. The image processing unit 147 calculates the characteristic amount of the shape of the cutting edge 131a by comparing the border line 142P-3 that exhibits an actual shape of the cutting edge 131a with a line 142P-4 that exhibits a standard shape of the cutting edge 131a.

Furthermore, when the surroundings are sufficiently bright, the light source unit 141 may be omitted.

Figure 10:
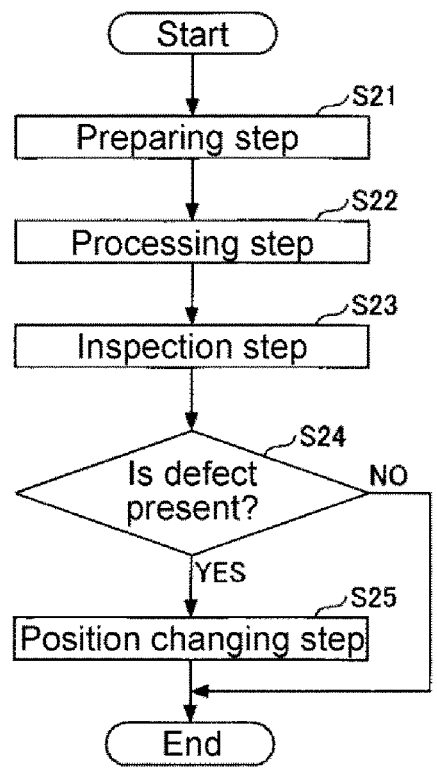
FIG. 10 is a flowchart illustrating a peeling method according to an exemplary embodiment.
Figure 11:
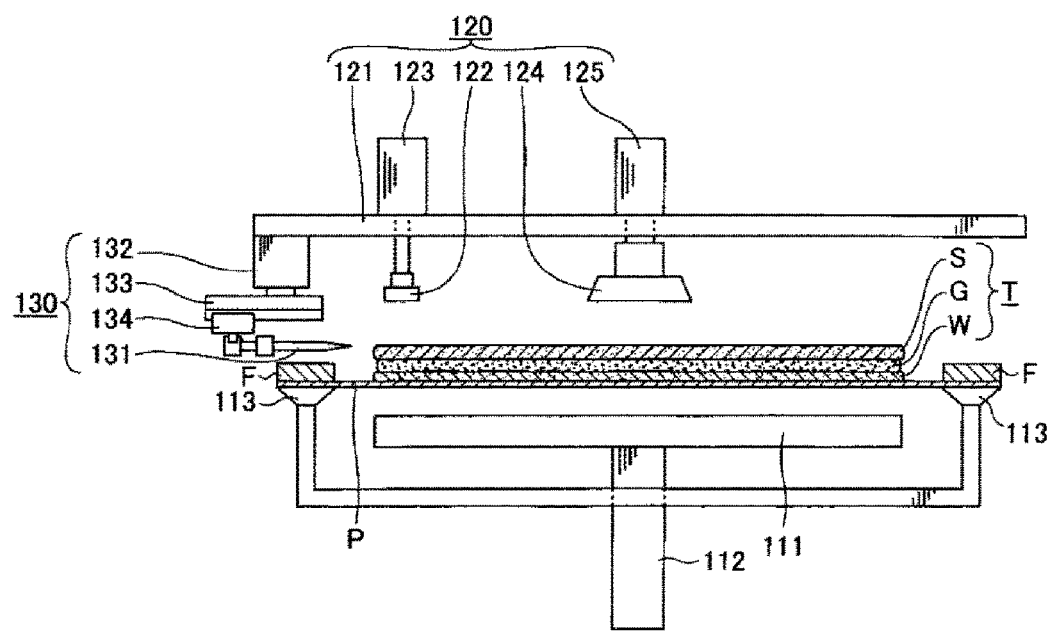
FIG. 11 is a view illustrating an exemplary state in which a frame holding unit holds a frame.
Figure 12:
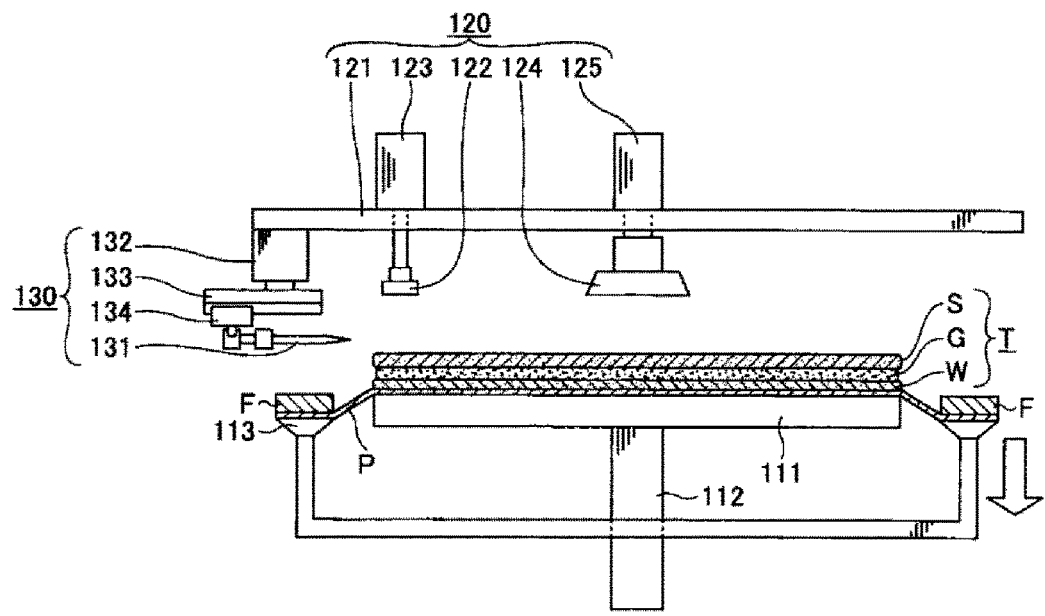
FIG. 12 is a view illustrating an exemplary state in which the frame holding unit is moved down from the state of FIG. 11 such that a substrate holding unit holds a processing target substrate via a tape.
Figure 13:
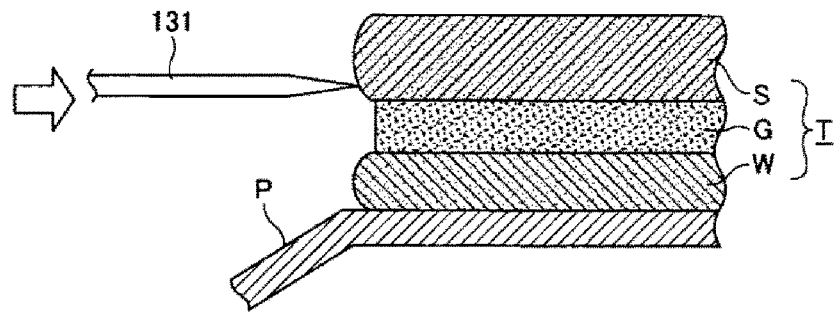
FIG. 13 is a view illustrating an exemplary state in which the blade is moved in an inserting direction from the state of FIG. 12 such that the blade is brought into contact with the superimposed substrate.
Figure 15:
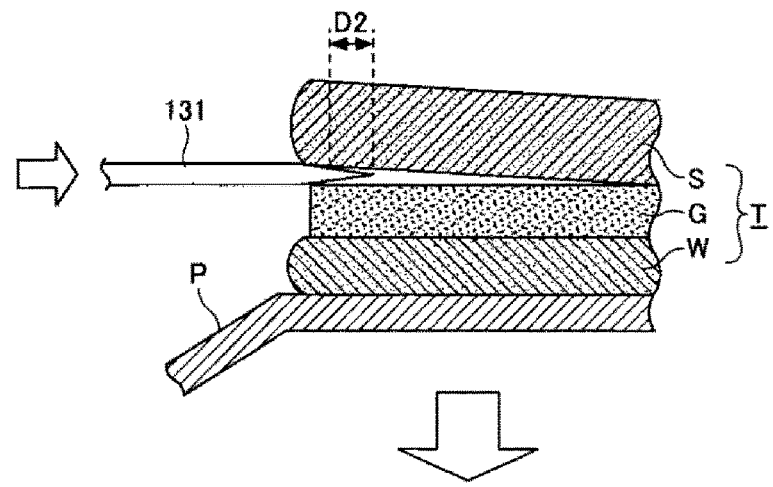
FIG. 15 is a view illustrating an exemplary state in which the blade is further moved in the inserting direction from the state of FIG. 14 such that the substrate holding unit and the frame holding unit are moved down.
Figure 16:
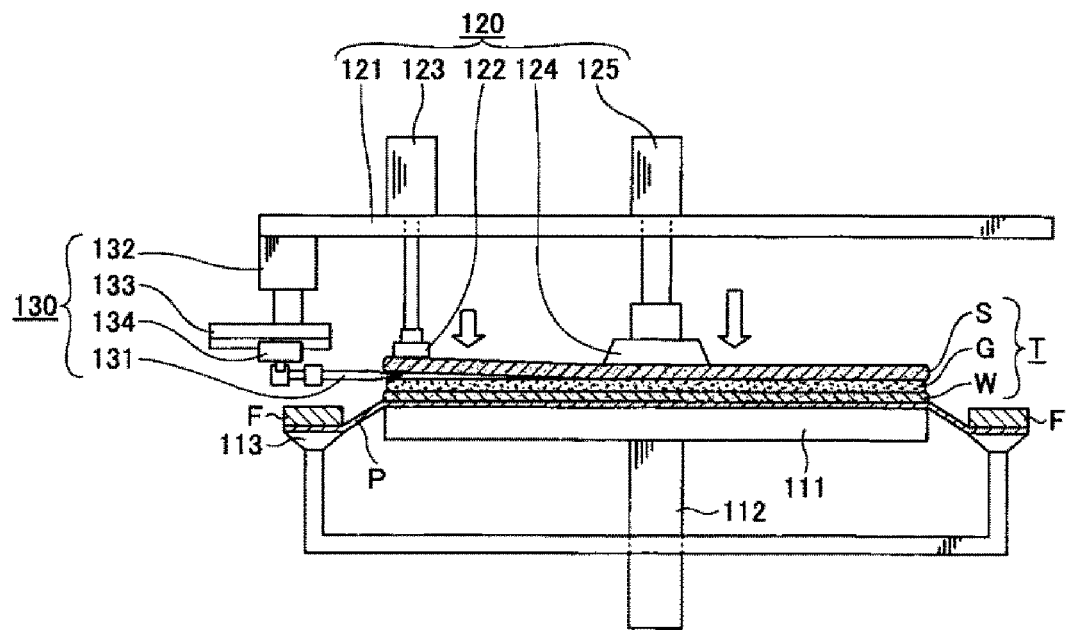
FIG. 16 is a view illustrating an exemplary state in which a support substrate is held by a substrate-periphery holding unit and a substrate-center holding unit.
Figure 17:
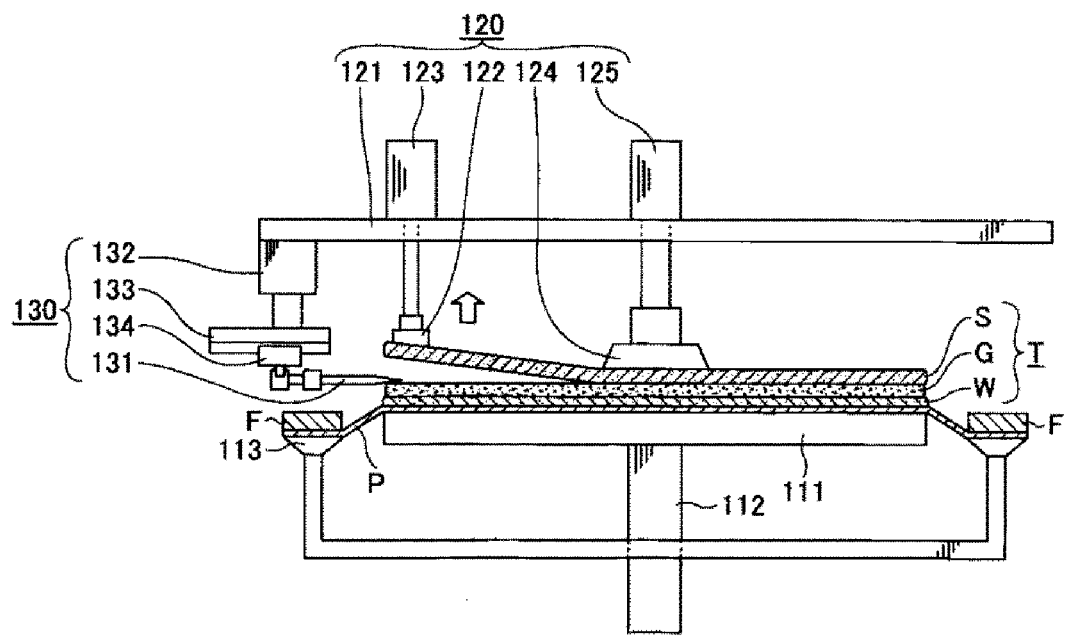
FIG. 17 is a view illustrating an exemplary state in which the substrate-periphery holding unit is move up from the state of FIG. 16.
Figure 18:
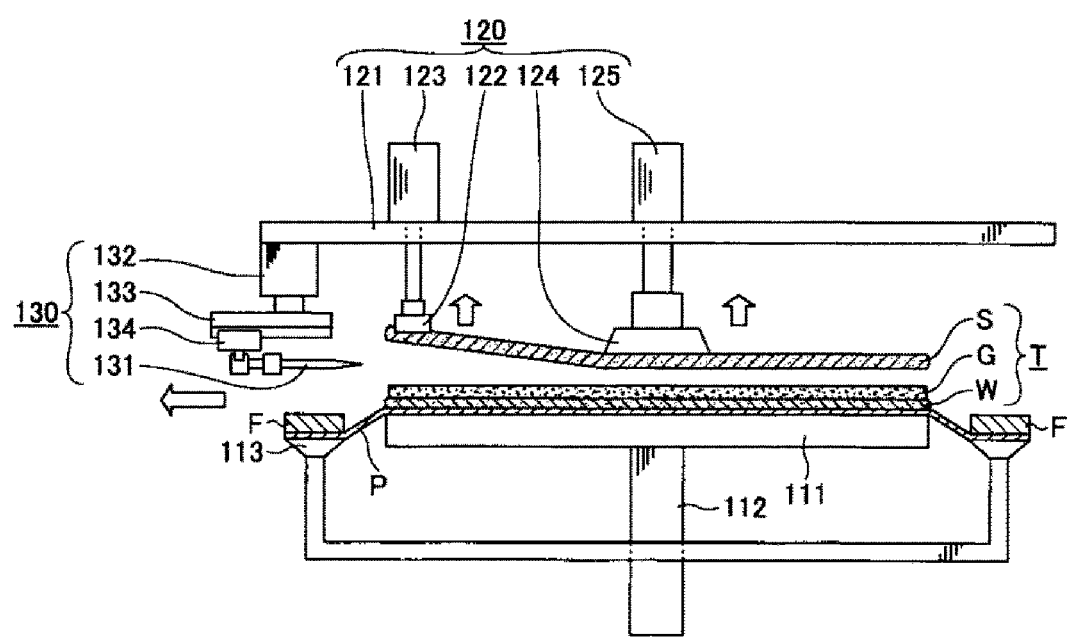
FIG. 18 is a view illustrating an exemplary state in which the substrate-periphery holding unit and the substrate-center holding unit are moved up from the state of FIG. 17.

FIG. 10 is a detailed flowchart illustrating a peeling process using a peeling apparatus according to an exemplary embodiment. FIG. 11 is a view illustrating an exemplary state in which a frame holding unit holds a frame. FIG. 12 is a view illustrating an exemplary state in which the frame holding unit is moved down from the state of FIG. 11, and thus a substrate holding unit holds a processing target substrate through a tape. FIG. 13 is a view illustrating an exemplary state in which a blade is moved in an inserting direction from the state of FIG. 12, and thus the blade is brought into contact with the superimposed substrate. FIG. 14 is a view illustrating an exemplary state in which the blade is further moved in the inserting direction from the state of FIG. 13. FIG. 15 is a view illustrating an exemplary state in which the blade is further moved in the inserting direction from the state of FIG. 14, and the substrate holding unit and the frame holding unit are moved down. FIG. 16 is a view illustrating an exemplary state in which a support substrate is held by a substrate-periphery holding unit and a substrate-center holding unit. FIG. 17 is a view illustrating an exemplary state in which the substrate-periphery holding unit is moved up from the state of FIG. 16. FIG. 18 is a view illustrating an exemplary state in which the substrate-periphery holding unit and the substrate-center holding unit move up from the state of FIG. 17.

As shown in FIG. 10, the peeling step S12 includes a preparation step S21, a processing step S22, an inspection step S23, a step S24 of checking whether a defect exists, and a position change step S25. These steps are performed under the control of the control device 30.

In the preparation step S21, the superimposed substrate T is held on the first holding unit 110. More specifically, first, as shown in FIG. 11, the frame holding unit 113 holds the frame F that is carried into the processing container 100 from the first conveyance apparatus 12. Subsequently, the lifting driving unit 115 moves the frame holding unit 113 down relative to the substrate holding unit 111. Thereby, the superimposed substrate T comes into contact with the substrate holding unit 111 via the tape P. Subsequently, as shown in FIG. 12, the substrate holding unit 111 holds the superimposed substrate T via a tape. At this time, the second holding unit 120 does not hold the superimposed substrate T.

In the processing step S22, a notch is formed as the peeling start point by inserting the blade 131 between the support substrate S and the processing target substrate W, and the support substrate S and the processing target substrate W are separated from each other from the peeling start point.

When the peeling start point is formed, first, as shown in FIG. 13, the Y direction moving unit 133 moves the blade 131 in the inserting direction so as to cause the cutting edge 131a of the blade 131 to come into contact with a side surface of the support substrate S. Since the support substrate S is thicker than the processing target substrate W or the glue layer G, a permissible range for adjusting the height of the blade 131 is wide. Furthermore, since the support substrate S does not become a product, no problem occurs even if the support substrate is scratched.

Next, as shown in FIG. 14, the Y direction moving unit 133 further moves the blade 131 by a distance D1 in the inserting direction. The side surface of the support substrate S is rounded, and an upward force acts on the support substrate S. Thereby, the notch is formed as the peeling start point.

Next, as shown in FIG. 15, the Y direction moving unit 133 further moves the blade 131 by a distance D2 in the inserting direction. In the meantime, the rotary lifting driving unit 118 moves the substrate holding unit 111 and the frame holding unit 113 down. Thereby, a downward force acts on the processing target substrate W, so that the notch is expanded. In this manner, the peeling start point is formed.

When the peeling is performed from the peeling start point, first, as shown in FIG. 16, the substrate-periphery holding unit 122 is moved down to come into contact with the superimposed substrate T, and the substrate-center holding unit 124 is moved down to come into contact with the superimposed substrate T. Subsequently, the substrate-periphery holding unit 122 holds a periphery of the superimposed substrate T (in detail, a vicinity of the peeling start point), and the substrate-center holding unit 124 holds the central portion of the superimposed substrate T. Next, as shown in FIG. 17, the substrate-periphery holding unit 122 moves up so as to gradually separate the support substrate S and the processing target substrate W from each other from the peeling start point. Next, as shown in FIG. 18, the substrate-periphery holding unit 122 and the substrate-center holding unit 124 are moved up so as to proceed with the peeling from the periphery to the central portion. Next, only the substrate-center holding unit 124 is moved up or only the substrate-periphery holding unit 122 is moved down so as to make the support substrate S horizontal. In the meantime, as shown in FIG. 18, the Y direction moving unit 133 pulls the blade 131 from the gap between the support substrate S and the processing target substrate W, thereby causing the blade 131 to return to its original position.

Thereafter, the rotary lifting driving unit 118 may integrally rotate the substrate holding unit 111 and the frame holding unit 113. When the residual debris of the glue layer G exists over the processing target substrate W and the support substrate S, the residual debris may be twisted away.

In the inspection step S23, the state of the cutting edge 131a of the blade 131 is inspected. More specifically, first, the imaging unit 142 images the cutting edge 131a. As shown in FIG. 8, the imaging region 142A of the imaging unit 142 includes a portion of the cutting edge 131a that first comes into contact with the superimposed substrate T. Since a larger load acts on the above-mentioned portion of the cutting edge than other portions when the peeling start point is formed, the above-mentioned portion is easily damaged. Subsequently, the image processing unit 147 processes the image 142P of the imaging unit 142 so as to inspect the state of the cutting edge 131*a*. The inspection items may include the existence/non-existence of a defect and the position of the defect. The image processing unit 147 outputs an inspected result to the control device 30.

The control device 30 performs a step to check whether a defect exists (step S24). When no defect exists (step S24, NO), the control device 30 terminates the peeling step S12. Meanwhile, when a defect exists (step S24, YES), the control device 30 performs the position change step S25, and then terminates the peeling step S12.

In the position change step S25, the notching start position of the cutting edge 131*a* is changed. More specifically, the X direction moving unit 134 moves the blade 131 in the X direction so as to change the notching start position of the cutting edge 131*a*. The moving amount may be larger than one half of a width D3 (see FIG. 8) of a portion of the cutting edge 131*a* that comes into contact with the superimposed substrate T when the blade 131 is moved by distance D1 in the inserting direction, as shown in FIG. 14. In the next peeling step S12, while the blade 131 is moved by a distance D1 in the inserting direction, a defect of the cutting edge 131*a* does not get in touch with the superimposed substrate T. In order to move the substrate holding unit 111 or the like down while the blade 131 is moved by a distance D2 in the inserting direction, as shown in FIG. 15, the defect of the cutting edge 131*a* may get in touch with the superimposed substrate T. Even if the moving direction of the cutting edge 131*a* slightly deviates downward as the defect of the cutting edge 131*a* get in touch with the superimposed substrate T, the cutting edge 131*a* does not get in touch with the processing target substrate W since the substrate holding unit 111 is moving down as shown in FIG. 15.

Instead of or in addition to the position change step S25, an output step may be performed. In the output step, the output device 40 outputs an alarm indicating that a defect exists. An example of a case of outputting the alarm may include a case in which defects increase in the process of repeatedly performing the peeling step S12 and then a candidate for the notching start position of the cutting edge 131*a* is lost. In the case of outputting the alarm, exchange of the blade 131 is performed.

Further, in the inspection step S23 of FIG. 10, the imaging region of the cutting edge 131*a* is not changed. However, the imaging may be repeatedly performed while changing the imaging region. The state of a wide range may be inspected. In the inspection step, a map indicating the state of the cutting edge 131*a* is prepared by processing a plurality of images of different imaging regions. The map indicates whether a defect exist at each position of the cutting edge 131*a*. Candidates for the notching start position of the cutting edge 131*a* may be increased so that the exchange of the blade 131 may be delayed.

Furthermore, the inspection step S23 of FIG. 10 is performed after the processing step S22. However, the inspection step S23 may be performed before the processing step S22 or before and after the processing step S22. The same applies to the position change step S25 of FIG. 10.

As described above, the peeling apparatus 15 includes an imaging unit 142 and an image processing unit 147. The imaging unit 142 images the cutting edge 131*a*, and the image processing unit 147 processes an image 142P of the imaging unit 142. Therefore, the state of the cutting edge 131*a* may be inspected so as to find the existence/non-existence of a defect or a position of the defect. When a defect exists on a portion of the cutting edge 131*a* that first comes into contact with the superimposed substrate T, measures may be taken in order to avoid damage to the processing target substrate W.

Furthermore, the peeling apparatus 15 includes an X direction moving unit 134 as the position change unit. The X direction moving unit 134 moves the blade 131 in the X direction relative to the first or second holding unit 110 or 120, thereby changing the notching start position of the cutting edge 131*a*. Such a change is performed based on the inspected result of the inspection unit 140. Damage to the processing target substrate W may be avoided so that the exchange of the blade 131 may be delayed.

Further, the peeling apparatus 15 includes an imaging region change unit 145. The imaging region change unit 145 changes the imaging region of the cutting edge 131*a*. The state of a wide range may be inspected by repeatedly performing imaging while changing the imaging region of the cutting edge 131*a*.

Furthermore, the peeling apparatus 15 prepares a map indicating the state of the cutting edge 131*a* by processing a plurality of images 142P of different imaging regions. The map indicates the existence/non-existence of a defect in each position of the cutting edge 131*a*. Candidates for the notching start position of the cutting edge 131*a* may be increased so that the exchange of the blade 131 may be delayed.

Further, the peeling apparatus 15 is provided with a light source unit 141. The light source unit 141 radiates light to the cutting edge 131*a*. As shown in FIG. 9, an image 142P obtained by the imaging unit 142 has a dark portion 142P-1 and a bright portion 142P-2. The dark portion 142P-1 is formed when the light from the light source unit 141 is screened by the blade 131. Meanwhile, the bright portion 142P-2 is formed when the light from the light source unit 141 pass outside the blade 131. A border line 142P-3 between the dark portion 142P-1 and the bright portion 142P-2 represents the cutting edge 131*a*. Since an abrupt change in luminance occurs in the border line 142P-3, the border line 142P-3 is clear.

Furthermore, the peeling apparatus 15 includes an output device 40. The output device 40 outputs an alarm based on the inspected result of the inspection unit 140. This may call an operator's attention to hurry the exchange of the blade 131. Therefore, damage to the processing target substrate W may be avoided.

For example, various kinds of processing target substrates W may be used. The processing target substrate may be, for example, a substrate for a semiconductor, a substrate for an FPD (flat panel display), or a substrate of a mask reticle for a photomask.

The processing target substrate W of the above-described exemplary embodiment is supported on the frame F during the peeling. However, the processing target substrate may not be supported on the frame F during the peeling. The substrate holding unit 111 may hold the processing target substrate W from the lower side without the tape P. In this case, since the frame F is not used, the frame holding unit 113 may be omitted.

While the inspection unit 140 of the above-described exemplary embodiment includes an imaging unit 142 and an image processing unit 147, the configuration of the inspection unit 140 is not limited particularly. For example, the inspection unit 140 may inspect the state of the cutting edge 131*a* using a laser displacement meter. Further, the inspection unit 140 may inspect the state of the cutting edge 131*a* using a transmissive optical fiber sensor. The transmissive optical fiber sensor includes a light transmitting unit and a light receiving unit. The blade 131 is provided between the light transmitting unit and the light receiving unit while compressing the cutting edge 131*a* against a sheet. It is possible to inspect the state of the cutting edge 131*a* by measuring a quantity of light leaking from a gap between the blade 131 and the sheet.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A peeling apparatus that separates a superimposed substrate, in which a first substrate and a second substrate are glued to each other, into the first substrate and the second substrate, the apparatus comprising:
   a blade configured to form a notch as a peeling start point between the first substrate and the second substrate; and
   an inspection unit configured to inspect a state of a cutting edge of the blade,
   wherein the inspection unit includes:
      a light source unit configured to irradiate light to the cutting edge of the blade;
      a capturing unit provided on a side opposite to the light source unit with reference to the blade and configured to capture the cutting edge;
      an image processing unit configured to process the image captured by the capturing unit; and
      a capturing unit configured to move the capturing unit in a direction following the cutting edge in order to change a capturing region of the cutting edge.

2. The peeling apparatus of claim 1, wherein the capturing unit is configured to partially capture the cutting edge.

3. The peeling apparatus of claim 2, wherein the image processing unit is further configured to prepare a map indicating the state of the cutting edge, by processing a plurality of images of different capturing regions.

4. The peeling apparatus of claim 1, wherein
   the image includes a dark portion formed when the light is screened by the blade, and a bright portion formed when the light pass outside the blade, and
   the image processing unit detects a border line between the dark portion and the bright portion.

5. The peeling apparatus of claim 1, further comprising:
   an output unit configured to output an alarm based on the inspected result of the inspection unit.

6. A peeling apparatus that separates a superimposed substrate, in which a first substrate and a second substrate are glued to each other, into the first substrate and the second substrate, the apparatus comprising:
   a blade configured to form a notch as a peeling start point between the first substrate and the second substrate;
   an inspection unit configured to inspect a state of a cutting edge of the blade; and
   a position change unit configured to change a notching start position of the cutting edge, based on an inspected result of the inspection unit,
   wherein the inspection unit includes:
      a light source unit configured to irradiate light to the cutting edge of the blade;
      a capturing unit provided on a side opposite to the light source unit with reference to the blade and configured to capture the cutting edge;
      an image processing unit configured to process the image captured by the capturing unit; and
      a capturing region change unit configured to move the capturing unit in a direction following the cutting edge in order to change a capturing region of the cutting edge.

7. The peeling apparatus of claim 6, wherein the position change unit is configured to move the blade in a direction perpendicular to a radial direction from the blade toward a center of the superimposed substrate.

8. A peeling system comprising:
   a peeling apparatus configured to separate a superimposed substrate, in which a first substrate and a second substrate are glued to each other, into the first substrate and the second substrate; and
   a cleaning unit configured to clean the first substrate that has been subjected to stripping,
   wherein the peeling apparatus claimed in claim 1 is provided as the peeling apparatus.

9. A peeling method of separating a superimposed substrate, in which a first substrate and a second substrate are glued to each other, into the first substrate and the second substrate, the method comprising:
   forming a notch as a peeling start point by inserting a blade between the first substrate and the second substrate;
   separating the first substrate and the second substrate from each other from the peeling start point; and
   inspecting a state of a cutting edge by capturing the cutting edge of the blade using a capturing unit;
   wherein the inspecting includes:
      irradiating light, by a light source unit, to the cutting edge of the blade;
      capturing, by a capturing unit provided on a side opposite to the light source unit with reference to the blade, the cutting edge;
      processing, by an image processing unit, the image captured by the capturing unit; and
      moving, by a capturing region change unit, the capturing unit in a direction following the cutting edge in order to change a capturing region of the cutting edge.

10. The peeling method of claim 9, wherein the capturing unit partially captures the image of the cutting edge, and
   at the inspecting, capturing is repeatedly performed by the capturing unit while changing a capturing region of the cutting edge.

11. The peeling method of claim 10, wherein, at the inspecting, a map indicating the state of the cutting edge is prepared by processing a plurality of images of different capturing regions.

12. The peeling method of claim 9, wherein, at the inspecting,
   the image includes a dark portion formed when the light is screened by the blade, and a bright portion formed when the light pass outside the blade, and
   in the inspection step, a border line is detected between the dark portion and the bright portion.

13. The peeling method of claim 9, further comprising:
   outputting an alarm based on the inspected result at the inspecting.

14. A peeling method of separating a superimposed substrate, in which a first substrate and a second substrate are glued to each other, into the first substrate and the second substrate, the method comprising:
- forming a notch as a peeling start point by inserting a blade between the first substrate and the second substrate;
- separating the first substrate and the second substrate from each other from the peeling start point;
- inspecting a state of a cutting edge of the blade; and
- changing a notching start position of the cutting edge, based on an inspected result at the inspecting,
- wherein the inspecting includes:
  - irradiating light, by a light source unit, to the cutting edge of the blade;
  - capturing, by a capturing unit provided on a side opposite to the light source unit with reference to the blade, the cutting edge;
  - processing, by an image processing unit, the image captured by the capturing unit; and
  - moving, by a capturing region change unit, the capturing unit in a direction following the cutting edge in order to change a capturing region of the cutting edge.

* * * * *